United States Patent
Cheng et al.

(10) Patent No.: US 11,848,205 B2
(45) Date of Patent: Dec. 19, 2023

(54) SEMICONDUCTOR STRUCTURE AND MANUFACTURING METHOD THEREFOR

(71) Applicant: ENKRIS SEMICONDUCTOR, INC., Suzhou (CN)

(72) Inventors: Kai Cheng, Suzhou (CN); Kai Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 443 days.

(21) Appl. No.: 17/143,902

(22) Filed: Jan. 7, 2021

(65) Prior Publication Data

US 2021/0125825 A1    Apr. 29, 2021

Related U.S. Application Data

(63) Continuation of application No. PCT/CN2019/074394, filed on Feb. 1, 2019.

(51) Int. Cl.
*H01L 21/02* (2006.01)
*H01L 29/20* (2006.01)
(Continued)

(52) U.S. Cl.
CPC .... *H01L 21/02502* (2013.01); *H01L 21/0242* (2013.01); *H01L 21/02378* (2013.01);
(Continued)

(58) Field of Classification Search
CPC ......... H01L 21/02502; H01L 21/02378; H01L 21/02381; H01L 21/02389; H01L 21/0242;
(Continued)

(56) References Cited

U.S. PATENT DOCUMENTS

2012/0025203 A1* 2/2012 Nakata .................. H01L 29/207 257/E29.089
2012/0025205 A1* 2/2012 Nakata ................ H01L 29/7787 257/77
(Continued)

FOREIGN PATENT DOCUMENTS

CN    106935644 A    7/2017

OTHER PUBLICATIONS

International Search Report in corresponding PCT Application No. PCT/CN2019/074394, dated Oct. 21, 2019.
(Continued)

*Primary Examiner* — Fernando L Toledo
*Assistant Examiner* — Jahae Kim
(74) *Attorney, Agent, or Firm* — Westbridge IP LLC (57) ABSTRACT

A semiconductor structure and a manufacturing method therefor are provided by embodiments of the present application. A buffer layer is disposed on a substrate layer, and the buffer layer includes a first buffer layer and a second buffer layer. By doping a transition metal in the first buffer layer, a deep level trap may be formed to capture background electrons, and diffusion of free electrons toward the substrate may also be avoided. In the second buffer layer, by decreasing a doping concentration of the transition metal or not doping intentionally the transition metal, a tailing effect is avoided and current collapse is prevented. By doping periodically C in the buffer layer, C may be as an acceptor impurity to compensate the background electrons, and then a concentration of the background electrons is reduced.

20 Claims, 5 Drawing Sheets

(51) Int. Cl.
*H01L 29/205* (2006.01)
*H01L 29/778* (2006.01)

(52) U.S. Cl.
CPC .. *H01L 21/02381* (2013.01); *H01L 21/02389* (2013.01); *H01L 21/02422* (2013.01); *H01L 21/02458* (2013.01); *H01L 29/2003* (2013.01); *H01L 29/205* (2013.01); *H01L 29/7786* (2013.01)

(58) Field of Classification Search
CPC ......... H01L 21/02422; H01L 21/02458; H01L 29/2003; H01L 29/205; H01L 29/7786; H01L 21/0254; H01L 21/02576; H01L 21/02581; H01L 29/36; H01L 29/207
See application file for complete search history.

(56) References Cited

U.S. PATENT DOCUMENTS

| | | | |
|---|---|---|---|
| 2015/0076509 A1* | 3/2015 | Ishiguro | H01L 21/0262 438/172 |
| 2015/0303293 A1 | 10/2015 | Tanaka et al. | |
| 2017/0179271 A1 | 6/2017 | Fenwick et al. | |
| 2017/0301761 A1* | 10/2017 | Era | H01L 29/2003 |

OTHER PUBLICATIONS

Written Opinion in corresponding PCT Application No. PCT/CN2019/074394, dated Oct. 21, 2019.

\* cited by examiner

SEMICONDUCTOR STRUCTURE AND MANUFACTURING METHOD THEREFOR

CROSS-REFERENCE TO RELATED APPLICATIONS

The present application is a continuation of International application No. PCT/CN2019/074394 filed on Feb. 1, 2019, the entire contents of which are incorporated herein by reference.

TECHNICAL FIELD

Embodiments of the present application relate to the field of microelectronic technologies, in particular to a semiconductor structure and a manufacturing method therefor.

BACKGROUND

High Electron Mobility Transistor (HEMT) is a kind of heterojunction field effect transistor. Taking AlGaN/GaN HEMT as an example, since a band gap of AlGaN is greater than that of GaN, two-Dimensional Electron Gas (2DEG) is formed at an interface between AlGaN and GaN if a heterojunction is formed by AlGaN and GaN. Therefore, HEMT is also known as 2DEG field effect transistor.

As for GaN-based HEMTs, if other impurities or a transition metal such as iron is doped into a region located below the 2DEG, a pinch-off characteristic may be improved, or a cut-off voltage may be increased. However, electrons trapped by charge traps formed by an impurity may hinder formation of the 2DEG, thus being prone to current collapse. Although reducing a doping concentration of the impurity is beneficial to suppress the current collapse, the current collapse cannot be also eliminated if a thickness of a buffer layer is not adjusted accurately.

SUMMARY

In view of this, a semiconductor structure and a manufacturing method therefor are provided to suppress leakage current, improve a pinch-off characteristic of a device and avoid current collapse. Therefore, the leakage current of the device with the semiconductor structure may be balanced in dynamic characteristics.

A semiconductor structure is provided according to an embodiment of the present application. The semiconductor structure includes a substrate and a buffer layer disposed on the substrate. The buffer layer includes a first buffer layer and a second buffer layer upward from the substrate in turn. The first buffer layer is co-doped with a transition metal, C and an n-type impurity, A doping concentration of the transition metal remains constant. A doping concentration of C is not greater than the doping concentration of the transition metal, and a doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C. The n-type impurity refers to an impurity that converts a GaN-based semiconductor into an n-type semiconductor. In the first buffer layer, a doping thickness of the n-type impurity is not greater than a doping thickness of C, and the doping thickness of C is not greater than a doping thickness of the transition metal. The second buffer layer is doped with a transition metal, and a doping concentration of the transition metal in the second buffer layer is less than the doping concentration of the transition metal in the first buffer layer.

Further, in an embodiment of the present application, the doping concentration of the transition metal in the second buffer layer decreases along a direction away from the substrate.

Further, in an embodiment of the present application, the semiconductor structure further includes the transition metal, C and an n-type impurity co-doped in the second buffer layer. A doping concentration of C is not greater than the doping concentration of the transition metal, and a doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C.

Further, in an embodiment of the present application, the semiconductor structure further includes a nucleating layer disposed between the substrate and the buffer layer.

A manufacturing method for a semiconductor structure is provided according to an embodiment of the present application. The manufacturing method includes providing a substrate and forming a buffer layer on the substrate. The buffer layer includes a first buffer layer and a second buffer layer upward from the substrate in turn. The first buffer layer is co-doped with a transition metal, C and an n-type impurity. A doping concentration of the transition metal remains constant. A doping concentration of C is not greater than the doping concentration of the transition metal, and a doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C. The n-type impurity refers to an impurity that converts a GaN-based semiconductor into an n-type semiconductor. In the first buffer layer, a doping thickness of the n-type impurity is not greater than a doping thickness of C, and the doping thickness of C is not greater than a doping thickness of the transition metal. The second buffer layer is doped with the transition metal, and the doping concentration of the transition metal in the second buffer layer is less than the doping concentration of the transition metal in the first buffer layer.

Further, in an embodiment of the present application, the doping concentration of the transition metal in the second buffer layer decreases along a direction away from the substrate.

Further, in an embodiment of the present application, the manufacturing method for the semiconductor structure further includes co-doping the transition metal, C and an n-type impurity in the second buffer layer. A doping concentration of C is not greater than the doping concentration of the transition metal, and a doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C.

Further, in an embodiment of the present application, the manufacturing method for the semiconductor structure further includes forming a nucleating layer between the substrate and the buffer layer.

The semiconductor structure and the manufacturing method therefor are provided by the present application. The buffer layer is disposed on the substrate layer, and the buffer layer includes the first buffer layer and the second buffer layer. By doping the transition metal in the first buffer layer, a deep level trap may be formed to capture background electrons, and diffusion of free electrons toward the substrate may also be avoided. In the second buffer layer, by decreasing the doping concentration of the transition metal or not doping intentionally the transition metal, a tailing effect is avoided and current collapse is prevented. By doping periodically C in the buffer layer, C may be as an acceptor impurity to compensate the background electrons, and then a concentration of the background electrons is reduced. At the same time, co-doping of the n-type impurity, the transition metal and C is mainly to compensate/neutralize a deep energy level introduced by defects such as dislocation, thereby obtaining a semiconductor structure with high crystal quality.

DETAILED DESCRIPTION OF THE EMBODIMENTS

The present application will be described in detail below in combination with specific embodiments shown in drawings. However, the present application may not be limited by the embodiments. Changes in structure, method or function made by those skilled in the art based on the embodiments are all included in the protection scope of the present application.

In addition, repeated labels or marks may be used in different embodiments. These repetitions are only for describing the present application briefly and clearly, instead of representing any correlation between the different embodiments and/or structures.

Figure 1:
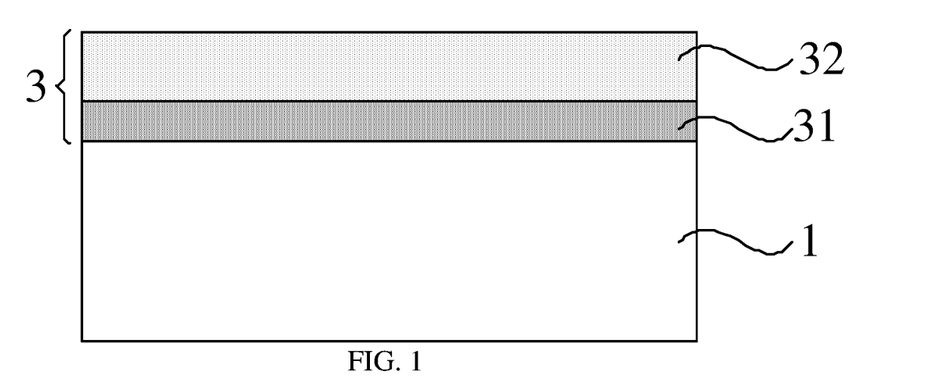
FIG. 1 shows a schematic structural diagram of a semiconductor structure according to an embodiment of the present application.

As shown in FIG. 1, a manufacturing method for a semiconductor structure includes providing a substrate 1 and forming a buffer layer 3 on the substrate 1. The buffer layer 3 includes a first buffer layer 31 and a second buffer layer 32 upward from the substrate 1 in turn.

In the embodiment, the substrate 1 is made of at least one of semiconductor materials, ceramic materials and polymer materials. For example, the substrate 1 is made of at least one of sapphire, silicon carbide, silicon, lithium niobate, Silicon On Insulator (SOI), gallium nitride and aluminum nitride.

In the embodiment, the first buffer layer 31 is co-doped with a transition metal, C and an n-type impurity. A doping concentration of the transition metal remains constant. A doping concentration of C is not greater than the doping concentration of the transition metal. A doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C.

The n-type impurity refers to an impurity, such as Si, Ge and O, that converts a GaN-based semiconductor into a n-type semiconductor.

In the embodiment, the second buffer layer 32 is doped with a transition metal. A doping concentration of the transition metal in the second buffer layer 32 is less than the doping concentration of the transition metal in the first buffer layer.

In the embodiment, the doping concentration of the transition metal in the second buffer layer 32 decreases along a direction away from the substrate.

Further, in the first buffer layer 31, the doping concentration of the transition metal is $1E17$ $cm^{-3}$ to $1E19$ $cm^{-3}$. In an embodiment, the doping concentration of the transition metal is $5E17$ $cm^{-3}$ to $5E18$ $cm^{-3}$. The transition metal forms a deep level trap in the buffer layer to capture background electrons.

Further, in the first buffer layer 31, the doping concentration of C is $5E15$ $cm^{-3}$ to $5E18$ $cm^{-3}$. In an embodiment, the doping concentration of C is $1E16$ $cm^{-3}$ to $1E18$ $cm^{-3}$. In the first buffer layer 31, C is used as an acceptor impurity to compensate the background electrons introduced by other impurities. The doping concentration of C cannot be too high, otherwise large dislocations may be introduced in the buffer layer.

Further, in the first buffer layer 31, the doping concentration of the n-type impurity is $1E15$ $cm^{-3}$ to $2E18$ $cm^{-3}$. In an embodiment, the doping concentration of the n-type impurity is $5E15$ $cm^{-3}$ to $5E17$ $cm^{-3}$. The n-type impurity is mainly used for compensating and/or neutralizing a deep energy level introduced by defects such as dislocation, so as to obtain a semiconductor structure with high crystal quality.

Further, the transition metal includes at least one of Ti, Cr, Mn, Fe, Co, Ni, Cu, Zn, Mo, Ag and Cd. In an embodiment, the transition metal is Fe.

Further, a thickness of the first buffer layer 31 is 0.01 μm to 5 μm. A thickness of the second buffer layer 32 is 0.05 μm to 5 μm.

Figure 2A:
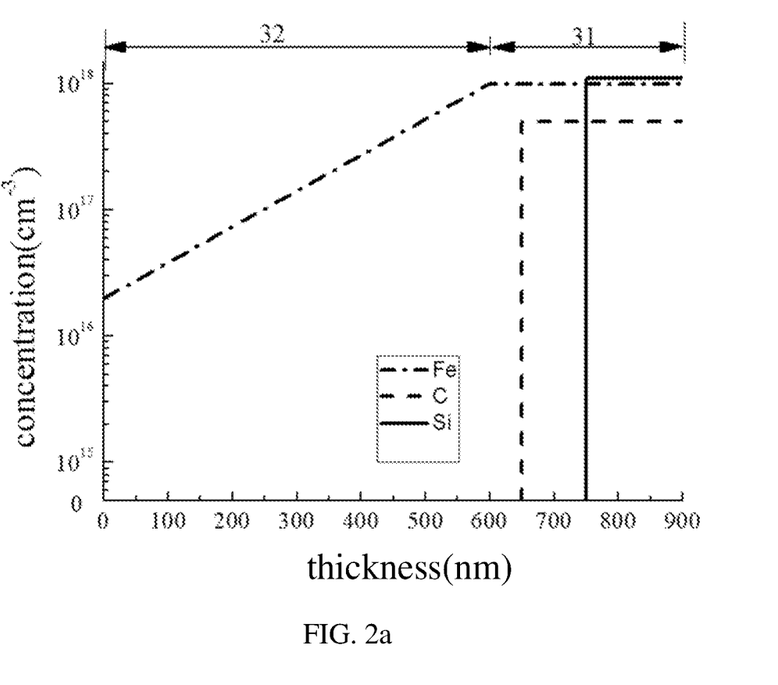
FIG. 2a-2f show doping modes of doping concentrations of a transition metal, C and an n-type impurity changed relative to a thickness in a semiconductor structure according to the present application.

Specifically, as shown in FIG. 2a, a horizontal axis represents a thickness of the buffer layer 3. An upper surface of the second buffer layer 32 is taken as 0 nm, and the closer to the substrate, the greater the thickness value represented by the horizontal axis is. A vertical axis represents doping concentrations of doping atoms. A thickness of the first buffer layer 31 is 300 nm (600 nm to 900 nm). The first buffer layer 31 is doped with Fe, C and Si. A doping thickness of Si is not greater than a doping thickness of C, and the doping thickness of C is not greater than a doping thickness of Fe. A doping concentration of Si is $1.1E18$ $cm^{-3}$, and doping of Si is stoped at 750 nm. Therefore, the doping thickness of Si is 150 nm, and a doping region of Si is 750 nm to 900 nm. A doping concentration of C is $5E17$ $cm^{-3}$, and doping of C is stoped at 650 nm. Therefore, a doping region of C is 650 nm to 900 nm, and the doping thickness of C is 250 nm. A doping concentration of Fe is $1E18$ $cm^{-3}$, and a doping region of Fe is 600 nm to 900 nm.

A thickness of the second buffer layer 31 is 600 nm (0 nm to 600 nm). Si and C are not doped in the second buffer layer, and a doping concentration of Fe gradually decreases to 2E16 cm$^{-3}$. A deep level trap formed due to the excessive concentration of the transition metal may form impurity scattering and reduce mobility.

Figure 2B:
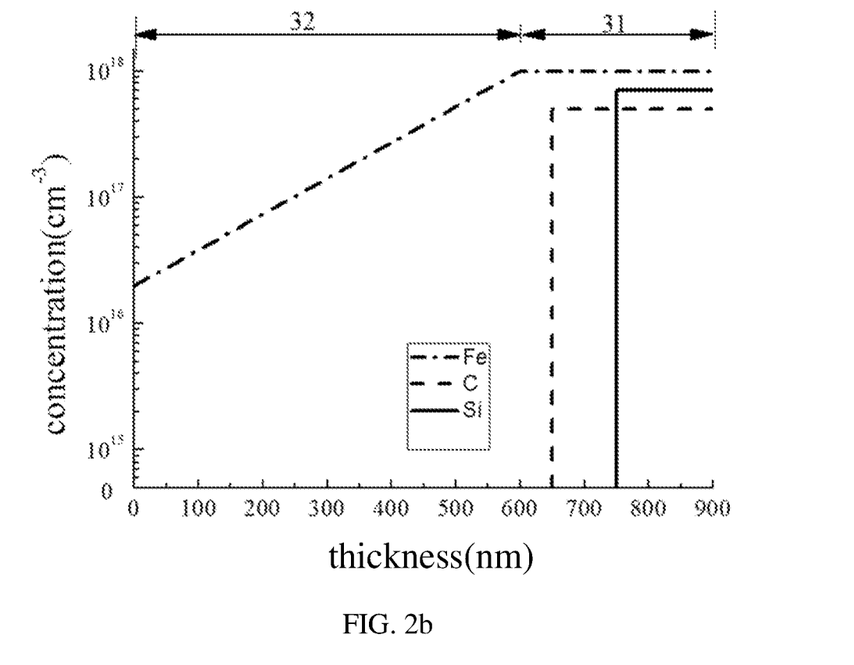

In the embodiment, in the first buffer layer, the doping concentration of Si is greater than the doping concentration of Fe, but less than sum of the doping concentration of Fe and the doping concentration of C. In other embodiments, in the first buffer layer, the doping concentration of Si may be less than the doping concentration of Fe and greater than the doping concentration of C. As shown in FIG. 2b, in the first buffer layer 31, the doping concentration of Si is 7E17 cm$^{-3}$, and the doping region of Si is 750 nm to 900 nm. The doping concentration of C is 5E17 cm$^{-3}$, and the doping region of C is 650 nm to 900 nm. The doping concentration of Fe is 1E18 cm$^{-3}$, and the doping region of Fe is 600 nm to 900 nm. In the second buffer layer, Si and C are not intentionally doped, and the doping concentration of Fe gradually decreases to 2E16 cm$^{-3}$.

Figure 2C:
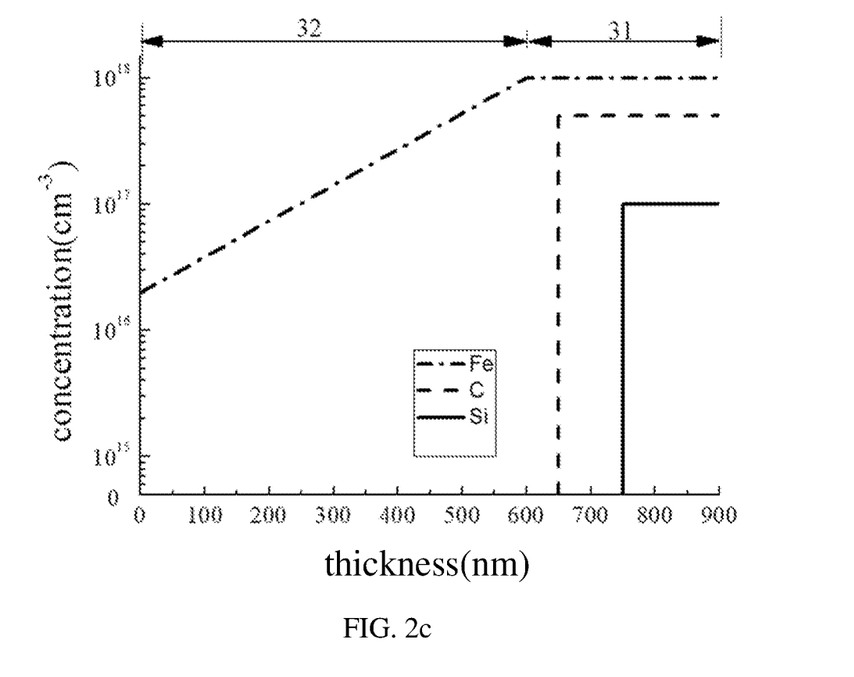

In an embodiment, in the first buffer layer, the doping concentration of Si is less than the doping concentration of C, and the doping concentration of Fe is less than the doping concentration of C. As shown in FIG. 2c, in the first buffer layer 31, the doping concentration of Si is 1E17 cm$^{-3}$, and the doping region of Si is 750 nm to 900 nm. The doping concentration of C is 5E17 cm$^{-3}$, and the doping region of C is 650 nm to 900 nm. The doping concentration of Fe is 1E18 cm$^{-3}$, and the doping region of Fe is 600 nm to 900 nm. In the second buffer layer, Si and C are not intentionally doped, and the doping concentration of Fe gradually decreases to 2E16 cm$^{-3}$.

Further, the semiconductor structure further includes the transition metal, C and an n-type impurity co-doped in the second buffer layer 32. A doping concentration of C is not greater than the doping concentration of the transition metal. A doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C.

Figure 2D:
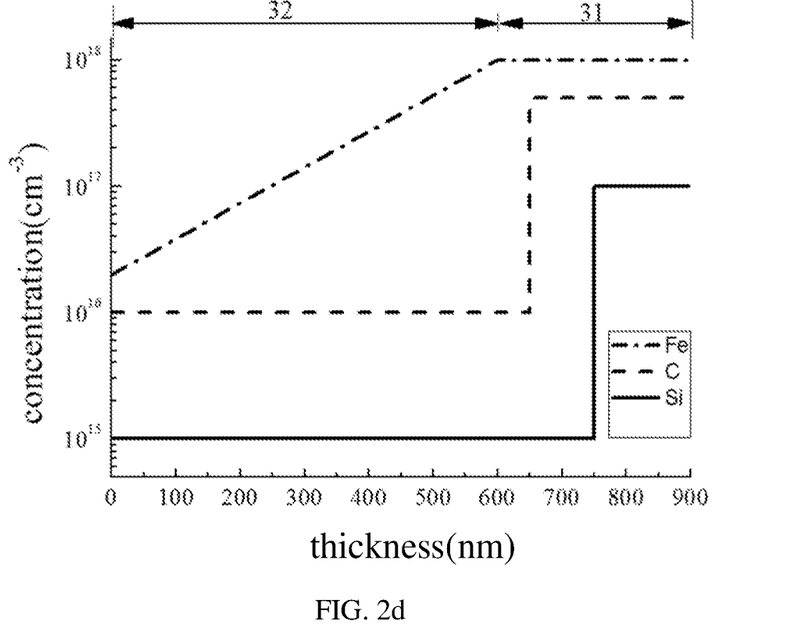

In the embodiment, the second buffer layer 32 is co-doped with the transition metal, C and an n-type impurity. Specifically, as shown in FIG. 2d, the thickness of the first buffer layer 31 is 300 nm (600 nm to 900 nm), and the thickness of the second buffer layer 31 is 600 nm (0 nm to 600 nm). The doping concentration of Si is 1E17 cm$^{-3}$ in a region of 750 nm to 900 nm, and the doping concentration of Si is 1E15 cm$^{-3}$ in a region of 0 nm to 750 nm. The doping concentration of C is 5E17 cm$^{-3}$ in a region of 650 nm to 900 nm, and the doping concentration of C is 1E16 cm$^{-3}$ in a region of 0 nm to 650 nm. The doping concentration of Fe is 1E18 cm$^{-3}$ in the first buffer layer 31, and the doping concentration of Fe gradually decreases to 2E16 cm$^{-3}$ in the second buffer layer 32.

It can be understood that in the second buffer layer 32, the doping concentration of Si may also be greater than the doping concentration of Fe, as long as the doping concentration of Si is less than sum of the doping concentration of Fe and the doping concentration of C.

Figure 2E:
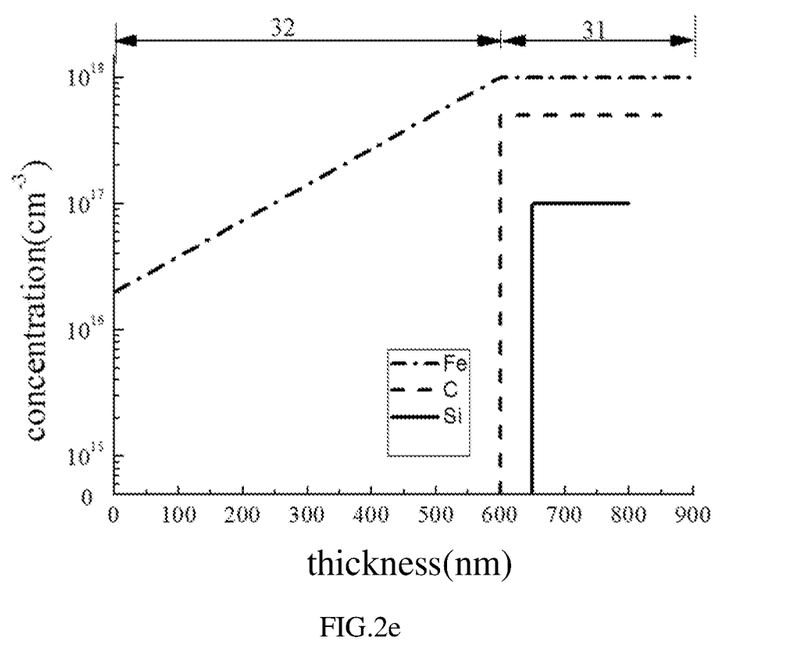

In above embodiments, Si, C and Fe are doped at the same time. In other embodiments, Si, C and Fe may be not doped at the same time. As shown in FIG. 2e, in the first buffer layer 31, the doping concentration of Si is 1E17 cm$^{-3}$, the doping of Si starts at 800 nm, and the doping region of Si is 650 nm to 800 nm. The doping concentration of C is 5E17 cm$^{-3}$, the doping of C starts at 850 nm, and the doping region of C is 600 nm to 850 nm. The doping concentration of the transition metal Fe is constant at 1E18 cm$^{-3}$. In the second buffer layer 32, the doping concentration of the transition metal Fe gradually decreases to 2E16 cm$^{-3}$.

It can be understood that Si and C are not doped intentionally in the second buffer layer 32 in the embodiments shown in FIGS. 2a, 2b, 2c and 2e. However, during an actual epitaxial growth process, a small amount of Si and C may remain in the second buffer layer 32 due to various growth environments. Concentrations of residual Si/C is less than 2E16 cm$^{-3}$ in the second buffer layer 32.

Figure 2F:
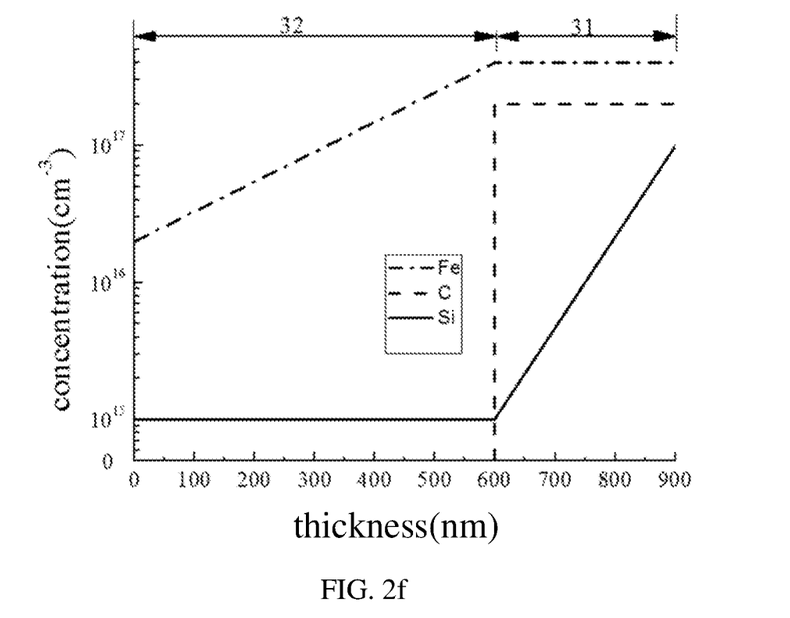

In other embodiments, the doping concentration of the n-type impurity gradually decreases in the first buffer layer 31. As shown in FIG. 2f, the doping concentration of Si decreases from 1E17 cm$^{-3}$ to 1E15 cm$^{-3}$ in the first buffer layer 31, and the doping concentration of Si remains constant at 1E15 cm$^{-3}$ in the second buffer layer. It is necessary to ensure that the doping concentration of the n-type impurity is not greater than sum of the doping concentration of C and the doping concentration of the transition metal. In addition, it is necessary to ensure that in the first buffer layer, the doping thickness of the n-type impurity is not greater than the doping thickness of C, and the doping thickness of C is not greater than the doping thickness of the transition metal.

It can be understood that decreasing slopes of the n-type impurity and the transition metal are not limited in the present application. The decreasing slopes and minimum doping concentrations of doped substances may be affected by factors such as temperature of manufacturing environment, the thickness of the buffer layer, bond energy of the doped transition metal, diffusion activation energy of the doped buffer layer, the doping modes of metals, and dislocation density between the buffer layer and the substrate layer.

Further, the described manufacturing method may be realized according to one or a combination of modes such as Atomic Layer Deposition (ALD), Chemical Vapor Deposition (CVD), Molecular Beam Epitaxy (MBE), Plasma Enhanced Chemical Vapor Deposition (PECVD), Low Pressure Chemical Vapor Deposition (LPCVD), Physical Vapor Deposition (PVD), Metal-Organic Molecular Beam Epitaxy (MOMBE) and Metal-Organic Chemical Vapor Deposition (MOCVD).

Figure 3:
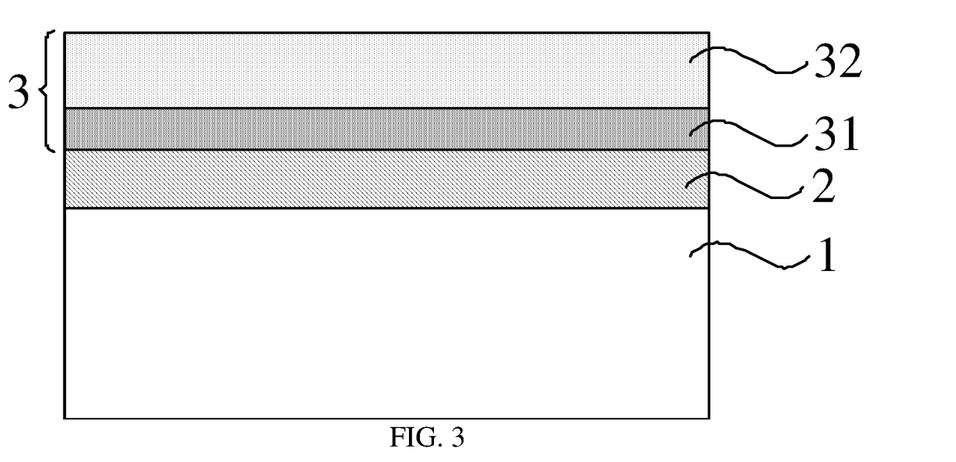
FIG. 3 shows a schematic structural diagram of a semiconductor structure according to another embodiment of the present application.

Further, as shown in FIG. 3, the manufacturing method for the semiconductor structure further includes forming a nucleating layer 2 between the substrate 1 and the buffer layer 3. The nucleating layer 2 is made of one of AN, GaN and AlGaN.

As shown in FIG. 3, a schematic diagram of a semiconductor structure is provided according to an embodiment of the present application. The semiconductor structure includes a substrate 1 and a buffer layer 3 disposed on the substrate 1. The buffer layer 3 includes a first buffer layer 31 and a second buffer layer 32 upward from the substrate in turn.

The first buffer layer 31 is co-doped with a transition metal, C and an n-type impurity. A doping concentration of the transition metal remains constant, and a doping concentration of C is not greater than the doping concentration of the transition metal. A doping concentration of the n-type impurity is not greater than sum of the doping concentration of C and the doping concentration of the transition metal. In an embodiment, the doping concentration of C is less than the doping concentration of the transition metal. The doping concentration of the n-type impurity is less than the doping concentration of C.

The n-type impurity refers to an impurity that converts a GaN-based semiconductor into an n-type semiconductor.

In the first buffer layer, a doping thickness of the n-type impurity is not greater than a doping thickness of C, and the doping thickness of C is not greater than a doping thickness of the transition metal.

The second buffer layer 32 is doped with a transition metal. A doping concentration of the transition metal in the second buffer layer is less than the doping concentration of the transition metal in the first buffer layer 31.

Further, in the second buffer layer 32, the doping concentration of the transition metal decreases along a direction away from the substrate 1.

Further, the semiconductor structure further includes the transition metal, C and an n-type impurity co-doped in the second buffer layer 32. A doping concentration of C is not greater than the doping concentration of the transition metal. A doping concentration of the n-type impurity is not greater than sum of the doping concentration of C and the doping concentration of the transition metal. In an embodiment, the doping concentration of C is less than the doping concentration of the transition metal, and the doping concentration of the n-type impurity is less than the doping concentration of C.

Further, in the first buffer layer 31, the doping concentration of the transition metal is $1E17$ $cm^{-3}$ to $1E19$ $cm^{-3}$. In an embodiment, the doping concentration of the transition metal is $5E17$ $cm^{-3}$ to $5E18$ $cm^{-3}$.

Further, in the first buffer layer 31, the doping concentration of C is $5E15$ $cm^{-3}$ to $5E18$ $cm^{-3}$. In an embodiment, the doping concentration of C is $1E16$ $cm^{-3}$ to $1E18$ $cm^{-3}$.

Further, in the first buffer layer 31, the doping concentration of the n-type impurity is $1E15$ $cm^{-3}$ to $2E18$ $cm^{-3}$. In an embodiment, the doping concentration of the n-type impurity is $5E15$ $cm^{-3}$ to $5E17$ $cm^{-3}$.

Further, the transition metal includes at least one of Ti, Cr, Mn, Fe, Co, Ni, Cu, Zn, Mo, Ag and Cd. The n-type impurity includes at least one of Si, Ge and O. In an embodiment, the transition metal is Fe, and the n-type impurity is Si.

Further, a thickness of the first buffer layer 31 is 0.01 μm to 5 μm. A thickness of the second buffer layer 32 is 0.05 μm to 5 μm.

Further, the substrate is made of at least one of semiconductor materials, ceramic materials and polymer materials. In an embodiment, the substrate include is made of at least one of sapphire, silicon carbide, silicon, lithium niobate, Silicon On Insulator (SOI), gallium nitride and aluminum nitride.

In the embodiments, the semiconductor structure may further include the nucleating layer 2 disposed between the substrate 1 and the buffer layer 3 to reduce dislocation density and defect density, and prevent remelting.

The semiconductor structure may be applied to various device structures, such as high electron mobility transistor, high electron mobility transistor including a heterojunction formed by aluminum gallium indium nitrogen and gallium nitride, high mobility triode including a heterojunction formed by aluminum nitride and gallium nitride, gallium nitride Metal-Oxide-Semiconductor Field-Effect Transistor (MOSFET), Light Emitting Diode (LED), photodetector, hydrogen generator and solar cell. For example, if the semiconductor structure is applied to a LED device, a light-emitting structure may be manufactured on the semiconductor structure. If the semiconductor structure is applied to a HEMT device, a heterojunction structure may be epitaxially grown on the semiconductor structure, as shown in FIG. 4.

Figure 4:
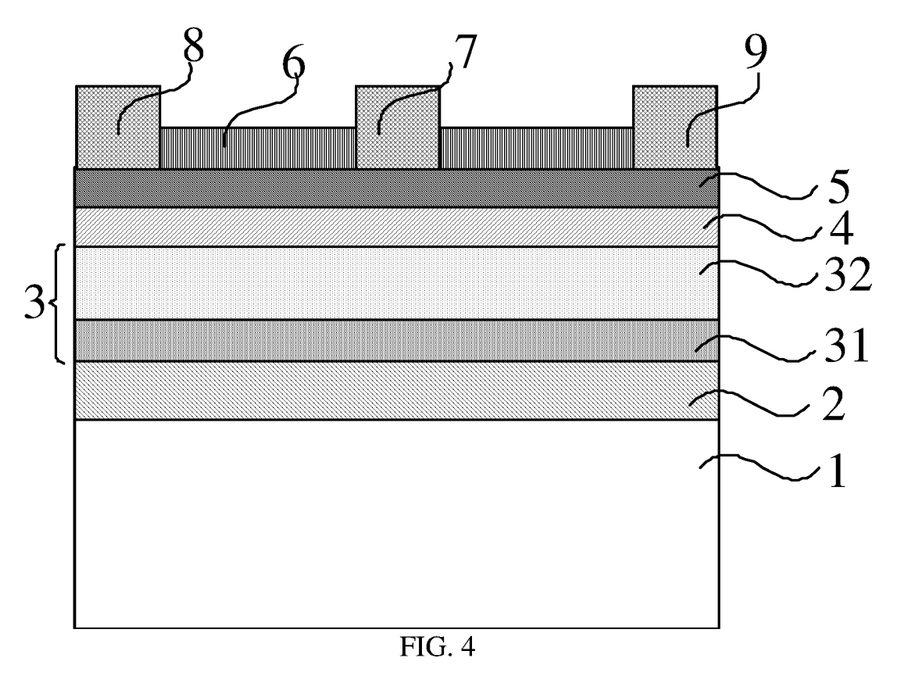
FIG. 4 shows a schematic structural diagram of a HEMT device configured with a semiconductor structure according to an embodiment of the present application.

FIG. 4 shows a schematic structural diagram of a HEMT device configured with a semiconductor structure. The HEMT device includes a substrate 1, a nucleating layer 2, a buffer layer 3, a channel layer 4, a barrier layer 5, a passivation layer 6, a gate electrode 7, a source electrode 8 and a drain electrode 9. The buffer layer 3 includes a first buffer layer 31 and a second buffer layer 32.

In the embodiment, the substrate 1 may be a Si substrate. In other embodiments, the substrate 1 may also be a sapphire substrate or a SiC substrate.

In the embodiment, the nucleating layer 2 is made of AN, the buffer layer 3 is made of AlGaN, the channel layer 4 is made of GaN, and the barrier layer 5 is made of AlGaN. 2DEG is formed at an interface between the channel layer 4 and the barrier layer 5.

In the embodiment, the passivation layer 6 may include at least one of silicon nitride, silicon dioxide, aluminum nitride, aluminum oxide, aluminum nitride oxide.

In the embodiment, ohmic contact is formed by the source electrode 8, the drain electrode 9 and the barrier layer 5. Schottky contact is formed by the gate electrode 7 and the passivation layer 6.

The present application provides the semiconductor structure and the manufacturing method therefor. The buffer layer is disposed on the substrate layer, and the buffer layer includes the first buffer layer and the second buffer layer. By doping the transition metal in the first buffer layer, the deep level trap may be formed to capture the background electrons, and diffusion of free electrons toward the substrate may also be avoided. In the second buffer layer, by decreasing the doping concentration of the transition metal or not doping intentionally the transition metal, the tailing effect is avoided and the current collapse is prevented. By doping periodically C in the buffer layer, C may be as an acceptor impurity to compensate the background electrons, and then a concentration of the background electrons is reduced. At the same time, the co-doping of the n-type impurity, the transition metal and C is mainly to compensate/neutralize a deep energy level introduced by defects such as dislocation, thereby obtaining a semiconductor structure with high crystal quality.

It may be understood that although the specification is described in accordance with the embodiments, not each of the embodiments only includes one independent technical solution. This narration manner in the specification is only for clarity. Those skilled in the art may regard the specification as a whole, and technical solutions in various embodiments may also be appropriately combined to form other embodiments that can be understood by those skilled in the art.

Also, unless otherwise required by context, singular terms shall include pluralities and plural terms shall include the singular.

The series of detailed descriptions listed above are only specific descriptions of feasible implementations of the present application, and are not used to limit the protection scope of the present application. Any equivalent implementation or modification made within the technical and spirit of the present application shall be included in the protection scope of the present application.

What is claimed is:

1. A semiconductor structure, comprising:
   a substrate;
   a buffer layer disposed on the substrate;

wherein the buffer layer comprises a first buffer layer and a second buffer layer upward from the substrate in turn, the first buffer layer is co-doped with a transition metal, Carbon (C) and an n-type impurity, a doping concentration of the transition metal remains constant, a doping concentration of C is not greater than the doping concentration of the transition metal, and a doping concentration of the n-type impurity is not greater than sum of the doping concentration of C and the doping concentration of the transition metal, in the first buffer layer, a doping thickness of the n-type impurity is less than a doping thickness of C, and the doping thickness of C is less than a doping thickness of the transition metal, the transition metal, C and n-type impurity in the first buffer layer are doped at different thicknesses along a direction away from the substrate, and the second buffer layer is doped with the transition metal, and the doping concentration of the transition metal in the second buffer layer is less than the doping concentration of the transition metal in the first buffer layer;

wherein the doping concentration of the transition metal in the first buffer layer is constant and in the second buffer layer decreases along the direction away from the substrate.

2. The semiconductor structure according to claim 1, wherein the second buffer layer is co-doped with the transition metal, C and an n-type impurity, a doping concentration of C is not greater than the doping concentration of the transition metal, and a doping concentration of the n-type impurity is not greater than sum of the doping concentration of C and the doping concentration of the transition metal.

3. The semiconductor structure according to claim 1, wherein the doping concentration of the transition metal in the second buffer layer decreases along a direction away from the substrate.

4. The semiconductor structure according to claim 1, wherein the doping concentration of the transition metal is IE17 cm-3 to IE19 cm-3 in the first buffer layer.

5. The semiconductor structure according to claim 1, wherein the doping concentration of C is 5E15 cm-3 to 5E18 cm-3 in the first buffer layer.

6. The semiconductor structure according to claim 1, wherein the doping concentration of the n-type impurity is IE15 cm-3 to 2E18 cm-3 in the first buffer layer.

7. The semiconductor structure according to claim 1, wherein the transition metal comprises at least one of Ti, Cr, Mn, Fe, Co, Ni, Cu, Zn, MO, Ag and Cd.

8. The semiconductor structure according to claim 1, wherein the n-type impurity includes at least one of Si, Ge and O.

9. The semiconductor structure according to claim 1, wherein a thickness of the first buffer layer is 0.01 gm to 5 gm, and a thickness of the second buffer layer is 0.05 gm to 5 gm.

10. The semiconductor structure according to claim 1, wherein the substrate is made of semiconductor materials, ceramic materials or polymer materials, and further made of sapphire, silicon carbide, silicon, lithium niobate, silicon on insulator, gallium nitride and aluminum nitride.

11. The semiconductor structure according to claim 1, further comprising a nucleating layer disposed between the substrate and the buffer layer.

12. The semiconductor structure according to claim 11, wherein the nucleating layer is made of one of AlN, GaN and AlGaN.

13. A manufacturing method for a semiconductor structure, comprising:

providing a substrate;

forming a buffer layer disposed on the substrate;

wherein the buffer layer comprises a first buffer layer and a second buffer layer upward from the substrate in turn, the first buffer layer is co-doped with a transition metal, Carbon (C) and an n-type impurity, a doping concentration of the transition metal remains constant, a doping concentration of C is not greater than the doping concentration of the transition metal, and a doping concentration of the n-type impurity is not greater than sum of the doping concentration of C and the doping concentration of the transition metal, a doping thickness of the n-type impurity is less than a doping thickness of C, and the doping thickness of C is less than a doping thickness of the transition metal in the first buffer layer, and the transition metal, C and n-type impurity in the first buffer layer are doped at different thicknesses along a direction away from the substrate, and the second buffer layer is doped with the transition metal, and the doping concentration of the transition metal in the second buffer layer is less than the doping concentration of the transition metal in the first buffer layer;

wherein the doping concentration of the transition metal in the first buffer layer is constant and in the second buffer layer decreases along the direction away from the substrate.

14. The manufacturing method for the semiconductor structure according to claim 13, wherein the second buffer layer is co-doped with the transition metal, C and an n-type impurity, a doping concentration of C is not greater than the doping concentration of the transition metal, and a doping concentration of the n-type impurity is not greater than sum of the doping concentration of C and the doping concentration of the transition metal.

15. The manufacturing method for the semiconductor structure according to claim 13, wherein the doping concentration of the transition metal in the second buffer layer decreases along a direction away from the substrate.

16. The manufacturing method for the semiconductor structure according to claim 13, wherein the doping concentration of the transition metal is IE17 cm-3 to IE19 cm-3 in the first buffer layer.

17. The manufacturing method for the semiconductor structure according to claim 13, wherein the doping concentration of C is 5E15 cm-3 to 5E18 cm-3 in the first buffer layer.

18. The manufacturing method for the semiconductor structure according to claim 13, wherein the doping concentration of the n-type impurity is IEI5 cm-3 to 2E18 cm-3 in the first buffer layer.

19. The manufacturing method for the semiconductor structure according to claim 13, further comprising:

forming a nucleating layer between the substrate and the buffer layer.

20. The manufacturing method for the semiconductor structure according to claim 19, wherein the nucleating layer is made of one of AlN, GaN and AlGaN.

* * * * *